United States Patent
Sundaresan (10) Patent No.: US 8,484,599 B2
(45) Date of Patent: Jul. 9, 2013

(54) PERFORMING VIA ARRAY MERGING AND PARASITIC EXTRACTION

(75) Inventor: Krishnakumar Sundaresan, Pleasanton, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/362,583

(22) Filed: Jan. 31, 2012

(65) Prior Publication Data

US 2012/0317531 A1  Dec. 13, 2012

Related U.S. Application Data

(60) Provisional application No. 61/495,806, filed on Jun. 10, 2011.

(51) Int. Cl.
*G06F 17/50* (2006.01)

(52) U.S. Cl.
USPC ............. 716/115; 716/52; 716/108; 716/111; 716/112; 716/113

(58) Field of Classification Search
USPC ...................... 716/50–56, 106–115
See application file for complete search history.

(56) References Cited

U.S. PATENT DOCUMENTS

| 7,203,629 | B2 * | 4/2007 | Ozis et al. ................. 703/2 |
| 8,214,784 | B2 * | 7/2012 | Su et al. ................. 716/110 |
| 2005/0017746 | A1 * | 1/2005 | Matsumoto et al. ......... 324/763 |
| 2006/0041849 | A1 * | 2/2006 | Aitnouri et al. ............ 716/2 |
| 2008/0034336 | A1 * | 2/2008 | Hirano ..................... 716/5 |
| 2008/0082947 | A1 * | 4/2008 | Ueda et al. ................ 716/8 |
| 2008/0313586 | A1 * | 12/2008 | Takaki ..................... 716/5 |
| 2009/0007035 | A1 * | 1/2009 | Su et al. .................. 716/5 |

* cited by examiner

*Primary Examiner* — Nha Nguyen
(74) *Attorney, Agent, or Firm* — Park, Vaughan, Fleming & Dowler, LLP; Fang Chen (57) ABSTRACT

Systems and techniques for performing parasitic extraction on a via array are described. If the via array is a single row or column via array, the system identifies a first via and a last via in the via array, and merges a set of vias between the first via and the last via into a center via. If the via array is a M×N ($M \geq 2$, $N \geq 2$) via array, the system merges the vias as follows: the first row and the last row of vias in the via array into a first row via and a last row via, respectively; the first column and the last column of vias in the via array into a first column via and a last column via, respectively; and a set of vias between the first and last rows and the first and last columns into a center via.

16 Claims, 7 Drawing Sheets

PERFORMING VIA ARRAY MERGING AND PARASITIC EXTRACTION

RELATED APPLICATION

This application claims priority to U.S. Provisional Application No. 61/495,806, entitled "Method and system for improved predictability, accuracy, and performance in via merging parasitic extraction," by Krishnakumar Sundaresan, filed 10 Jun. 2011, the contents of which are herein incorporated by reference.

BACKGROUND

1. Technical Field

This disclosure relates to electronic design automation (EDA). More specifically, this disclosure relates to parasitic extraction for via arrays during post-layout simulation.

2. Related Art

A via array is a group of vias arranged in a regular pattern of rows and columns but used as a single via to connect two nets. Via arrays exist in many types of circuits to provide redundancy, and to improve yield and reliability. Depending on how parasitics are extracted for the via array, the extraction can have a significant impact on the size and accuracy of the parasitic netlist and on the post-layout simulation runtime.

Existing extraction tools have many shortcomings. Existing extraction tools do not preserve point-to-point resistance when all vias in a via array are merged together. Existing extraction tools may produce large networks. Further, existing extraction tools may not be deterministic, i.e., they may produce different extracted resistance values in different runs, which can lead to inconsistency in simulation results.

SUMMARY

Some embodiments described herein provide systems and techniques for performing parasitic extraction on a via array. During operation, a system identifies a via array in a physical layout, wherein the via array is coupled between a first layer and second layer. Next, the system determines a type for the via array. If the system determines that the via array is a single row/column via array, the system then identifies the first via and the last via in the via array, and merges a set of vias between the first via and the last via into a center via. The system subsequently extracts a first via resistance, a last via resistance, and a center via resistance for the first via, the last via, and the center via, respectively.

In some embodiments, the system identifies a via array in the physical layout by identifying two or more vias that interconnect a first conducting region in the first layer with a second conducting region in the second layer.

In some embodiments, the system merges the set of vias between the first via and the last via into the center via by: replacing a first set of contacts associated with the set of vias in the first layer with a first node of the center via; and replacing a second set of contacts associated with the set of vias in the second layer with a second node of the center via.

In some embodiments, the system extracts the via resistance for the center via by dividing a single via resistance by the number of vias in the set of vias.

In some embodiments, the system computes a first interconnect resistance in an area in the first layer which overlaps the footprint of the via array. The system also computes a second interconnect resistance in an area in the second layer which overlaps the footprint of the via array. The system then divides the first interconnect resistance evenly between a first node of the first via, the first node of the center via, and a first node of the last via; and divides the second interconnect resistance evenly between a second node of the first via, the second node of the center via, and a second node of the last via.

In some embodiments, if the system determines that the via array is a M×N (M≧2, N≧2) via array, the system then merges the first row and the last row of vias in the via array into a first row via and a last row via, respectively. The system also merges the first column and the last column of vias in the via array into a first column via and a last column via, respectively. The system additionally merges a set of vias between the first and last rows and the first and last columns into a center via. The system subsequently extracts a first and last row via resistances, a first and last column via resistances, and a center via resistance for the first and last row vias, the first and last column vias, and the center via, respectively.

In some embodiments, the system extracts the first and last row/column via resistances by dividing a single via resistance by the number of vias in a row/column of vias. Moreover, the system extracts the center via resistance by dividing the single via resistance by the number of vias in the set of vias between the first and last rows and the first and last columns.

In some embodiments, the system computes a first interconnect resistance in an area in the first layer which overlaps the footprint of the via array. The system also computes a second interconnect resistance in an area in the second layer which overlaps the footprint of the via array. Next, the system distributes the first interconnect resistance evenly among a set of nodes of the first and last row vias, the first and last column vias, and the center via in the first layer. The system also distributes the second interconnect resistance evenly among a set of nodes of the first and last row vias, the first and last column vias, and the center via in the second layer.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. The term "non-transitory computer-readable storage medium" includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

Figure 1:
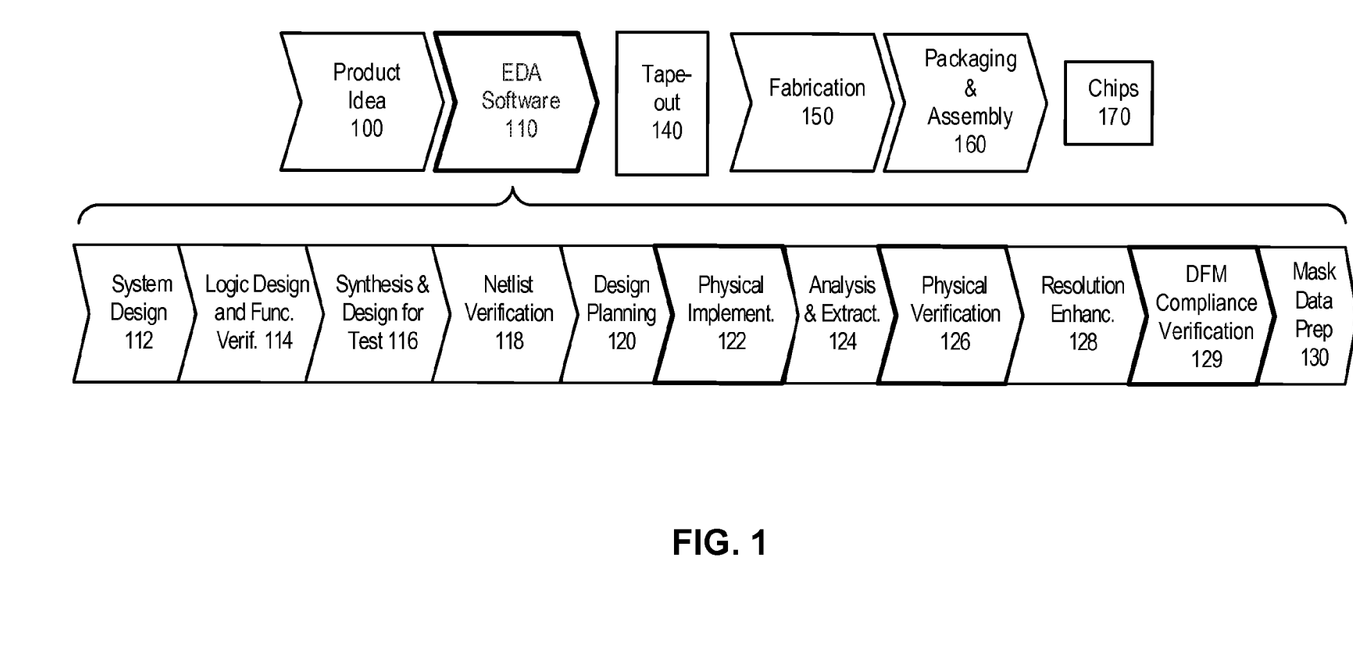
FIG. 1 illustrates various stages in the design and fabrication of an integrated circuit.

FIG. 1 illustrates various stages in the design and fabrication of an integrated circuit. The process starts with the generation of a product idea (stage 100), which is realized using an EDA software (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only, and is not intended to limit the scope of this disclosure. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage.

Logic design and functional verification (stage 114): At this stage, the VHDL or Verilog code for modules in the system is written and the design is checked for functional accuracy. More specifically, the design is checked to ensure that it produces the correct outputs.

Synthesis and design (stage 116): Here, the VHDL/Verilog is translated to a netlist. The netlist can be optimized for the target technology. Additionally, tests can be designed and implemented to check the finished chips.

Netlist verification (stage 118): At this stage, the netlist is checked for compliance with timing constraints and for correspondence with the VHDL/Verilog source code.

Design planning (stage 120): Here, an overall floor plan for the chip is constructed and analyzed for timing and top-level routing.

Physical implementation (stage 122): The placement (positioning of circuit elements) and routing (connection of the same) occurs at this stage.

Analysis and extraction (stage 124): At this stage, the circuit function is verified at a transistor level; this in turn permits what-if refinement.

Physical verification (stage 126): In this stage, the design is checked to ensure correctness for manufacturing, electrical issues, lithographic issues, and circuitry.

Resolution enhancement (stage 128): This stage involves geometric manipulations of the layout to improve manufacturability of the design.

DFM compliance verification (stage 129): In this stage, the design (mask layout) is checked to ensure correctness for manufacturing, electrical issues, mechanical stress issues, lithographic issues, and circuitry.

Mask data preparation (stage 130): This stage provides the "tape-out" data for production of masks to produce finished chips.

Some embodiments described herein provide a via array merging technique which preserves point-to-point resistance of a via array structure before and after the merging operation. In one embodiment, the present technique prevents a merged via node from migrating to the center of via array by identifying additional key via nodes along the boundaries of the via array. By preventing the via node migration to the center of the array, the present technique ensures that the resistance of the metal interconnect is not over estimated and thus point-to-point resistance of the via array is maintained.

Figure 2:
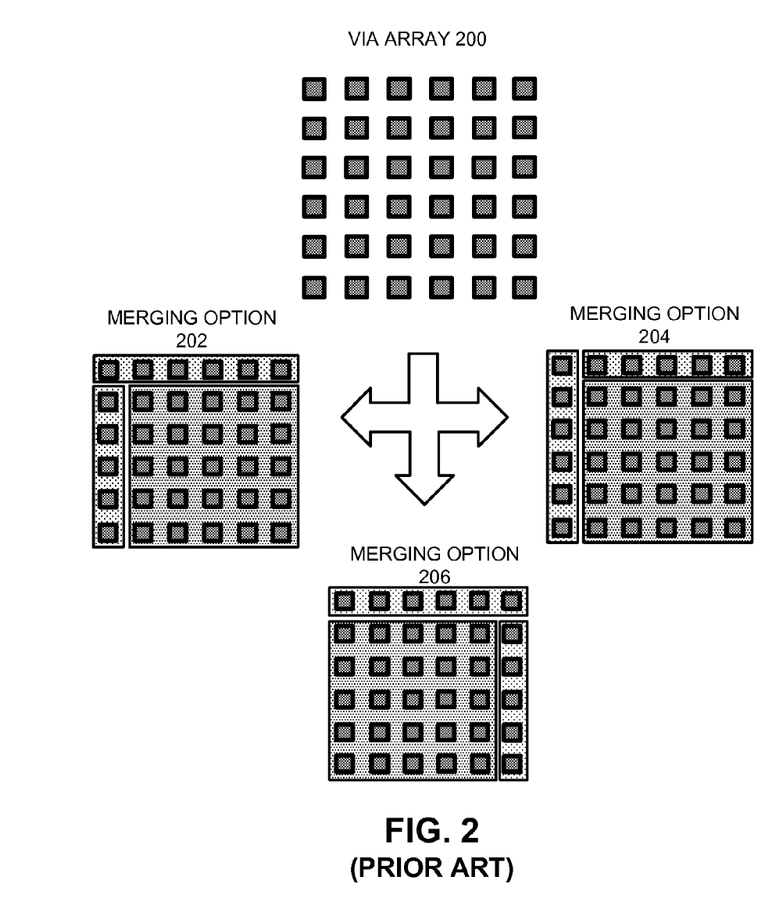
FIG. 2 illustrates some shortcomings of an existing via merging technique.

FIG. 2 illustrates some shortcomings of an existing via merging technique. As illustrated, a 6×6 via array 200 is to be grouped into 5×5 clusters. Existing techniques do not provide any predictability as to how the vias are grouped together. For example, the 5×5 cluster can be formed by either grouping the lower right set of 5×5 vias as shown in merging options 202 and 204, or by grouping the lower left set of 5×5 vias as shown in merging option 206. Moreover, once the first 5×5 cluster is identified, the rest of the vias can still be grouped differently. This is demonstrated in the different grouping configurations between merging options 202 and 204.

Figure 3:
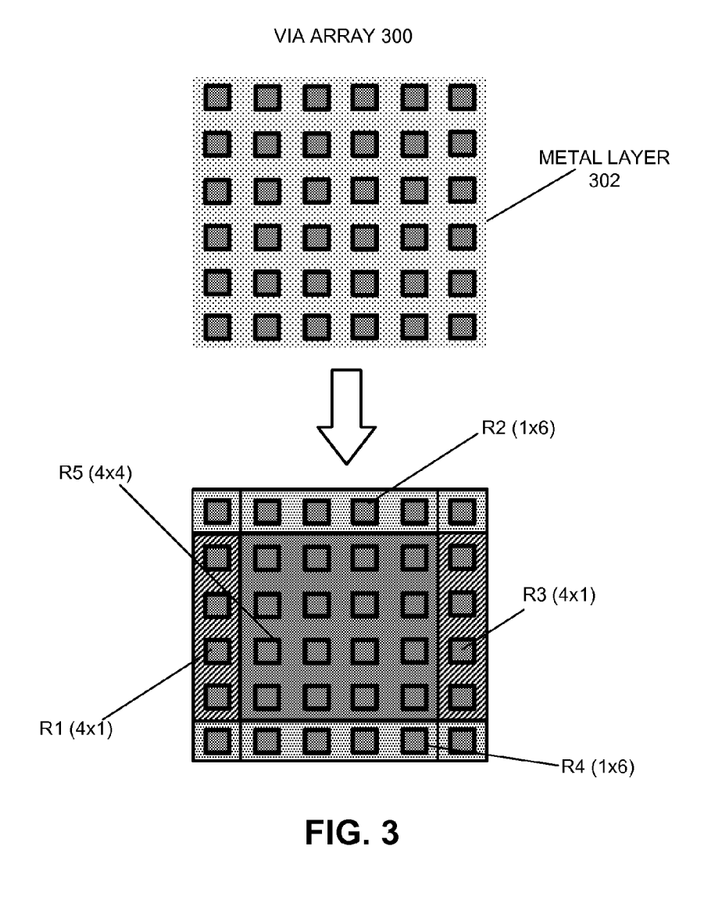
FIG. 3 illustrates a process for merging a via array in accordance with some embodiments described herein.

FIG. 3 illustrates a process for merging a via array in accordance with some embodiments described herein.

As illustrated in FIG. 3, via array 300 is partitioned into 5 regions where each region corresponds to a separate resistance. More specifically, the first and last rows (1×6) of vias are merged into node resistors R2 and R4, respectively; the first and last columns of vias minus the corner vias (4×1) are merged into node resistors R1 and R3; and the rest of the vias (4×4) in between are merged into a center node resistor R5.

In the embodiment shown, each of R1 and R3 will have ¼th of a single via resistance as a result of merging 4 vias in parallel; each of R2 and R4 will have ⅙th of a single via resistance as a result of merging 6 vias in parallel; and R5 will have ¹⁄₁₆th of a single via resistance as a result of merging 4×4 vias in parallel. In one embodiment, the underlying interconnect resistance of metal layer 302 is divided equally along the direction of current in metal layer 302 from each of the first and last row/column array to the center via array. This ensures symmetric distribution of resistance and preserves point-to-point resistance. We now describe a more detailed process for merging and extracting resistances of a via array.

Figure 4:
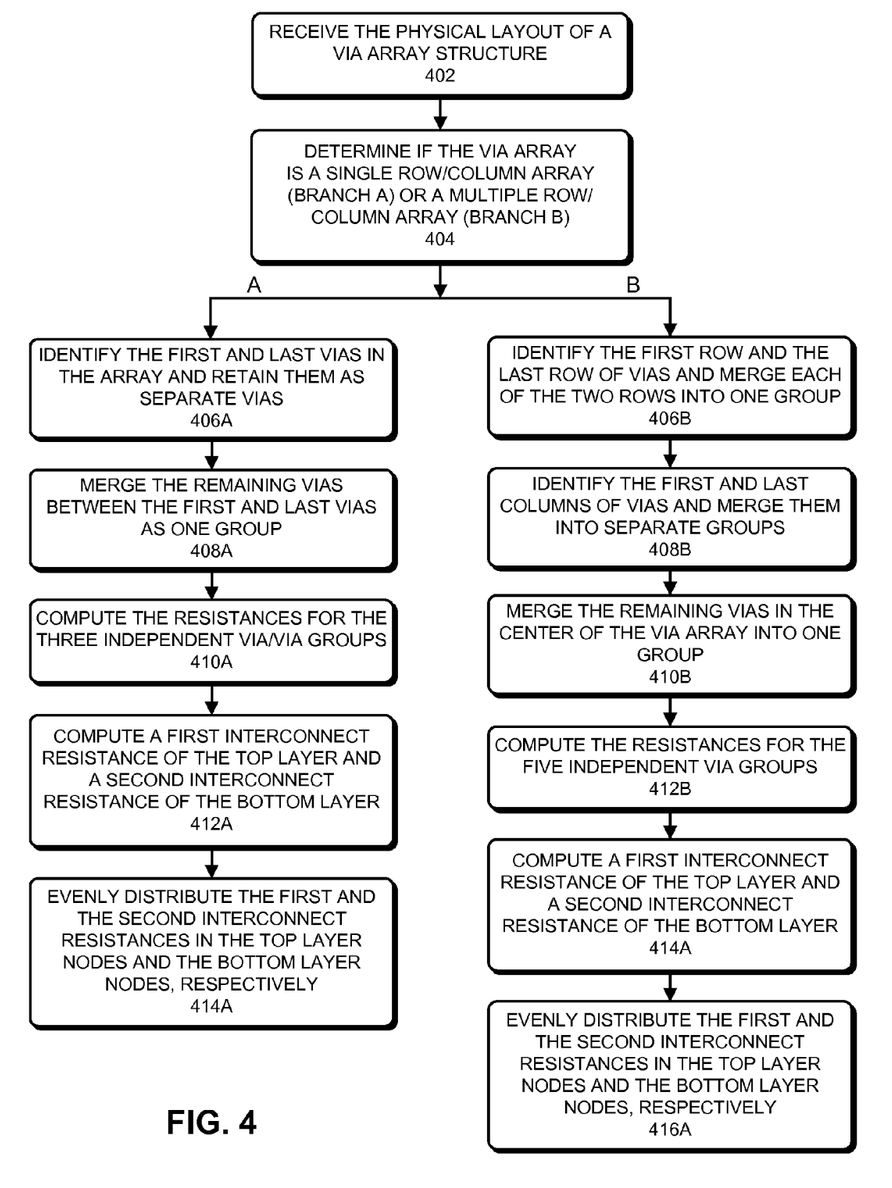
FIG. 4 presents a flowchart that illustrates a process for performing parasitic extraction on a via array in accordance with some embodiments described herein.

FIG. 4 presents a flowchart that illustrates a process for performing parasitic extraction on a via array in accordance with some embodiments described herein.

During operation, the process receives the physical layout of a via array structure (step 402). In one embodiment, the via array structure includes a top layer (e.g., a poly layer or a metal layer), a bottom layer (e.g., a poly layer or a metal layer), and a via array coupled between the top layer and the bottom layer. The process then identifies the type of the via array (step 404). In particular, the process determines whether the via array is a single row/column array (i.e., 1×N or N×1 array) or a multiple row/column array (i.e., M×N array, M≧2, N≧2). Different via merging and extraction processes can be performed depending on the type of via array.

Specifically, if the via array is a single row/column array, the process identifies the first and last vias (also referred to as "end vias" below) in the array and retains them as separate vias (step 406A). The process then merges the remaining vias in between the end vias as one group (step 408A). Next, the process computes the resistances for the three independent via/via groups (step 410A). Note that if all vias are identical in the vias array, which is a common case, then the resistance of the middle group is approximately 1/(N−2) of a single vias in the array, wherein N is the number of vias in the array.

After merging the via array into the three separate resistances, the total number of nodes in the via array is reduced to six: three coupled to the top layer and three coupled to the bottom layer. The process next computes a first interconnect resistance of the top layer in a first region which largely overlaps the via array footprint in the top layer, and also computes a second interconnect resistance of the bottom layer in a second region which largely overlaps the via array footprint in the bottom layer (step 412A). The process then evenly distributes the first interconnect resistance among the top three nodes of the merged vias array and similarly distributes the second interconnect resistance among the bottom three nodes of the merged vias array (step 414A). This step ensures symmetric distribution of resistance and preserves point-to-point resistance in the extracted via array. We describe a detailed embodiment of merging and extracting a single row/column via array below in conjunction with FIGS. 5A and 5B.

Returning to step 404, if the process identifies the via array as a multiple row/column array, the process identifies the first row and the last row of vias (also referred to as the "end rows" below), and then merges each of the two end rows into one group (step 406B). The process also identifies the first column and the last column of vias (also referred to as "end columns" below), and then merges each of the two end columns into one group (step 408B). Note that because the four corner vias are shared by one end row and one end column, each of them may be grouped only once. For example, if the process merges the entire first and last rows of vias into two separate groups, the process will merge the first and last columns of vias without the four corner vias. On the other hand, if the process merges the entire first and last columns of vias into the two separate groups, the process will merge the first and last rows of vias without the four corner vias into the other two groups.

The process then merges the remaining vias in the center of the via array into one group (step 410B). Next, the process computes the resistances for the five independent via groups (step 412B). Note that if all vias are identical in the vias array, which is a common case, then the resistance of the center group is approximately 1/((M−2)×(N−2)) of a single via, wherein M and N are the numbers of rows and columns of the vias array, respectively. Note that in the cases when M=2 or N=2, there are no remaining vias in the center of the via array. In such cases, step 410B is skipped and step 412B only extracts the resistances for the four independent via groups generated in steps 406B and 408B.

After merging the via array into the five separate resistances, the total number of nodes in the via array is reduced to ten: five which are coupled to the top layer and the other five which are coupled to the bottom layer. The process next computes a first interconnect resistance of the top layer in a region which largely overlaps the via array footprint in the top layer, and a second interconnect resistance of the bottom layer in a region which largely overlaps the via array footprint in the bottom layer (step 414B). The process then evenly distributes the first interconnect resistance among the top five nodes of the merged vias array along the direction of current flow and similarly distributes the second resistance among the bottom five nodes of the merged vias array along the direction of current flow (step 416B). This step ensures symmetric distribution of resistance and preserves point-to-point resistance in the extracted via array. We describe a detailed embodiment of merging and extracting a multiple row/column array below in conjunction with FIGS. 6A and 6B.

Figure 5A:
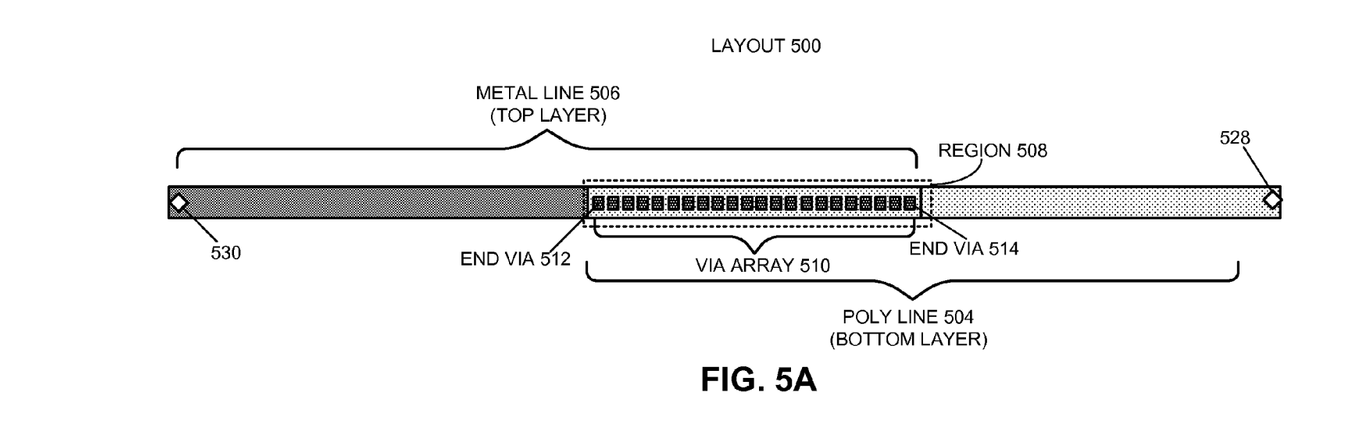
FIGS. 5A-5B illustrate a single row via array structure and a process for merging and extracting the via array in accordance with some embodiments described herein.
Figure 5B:
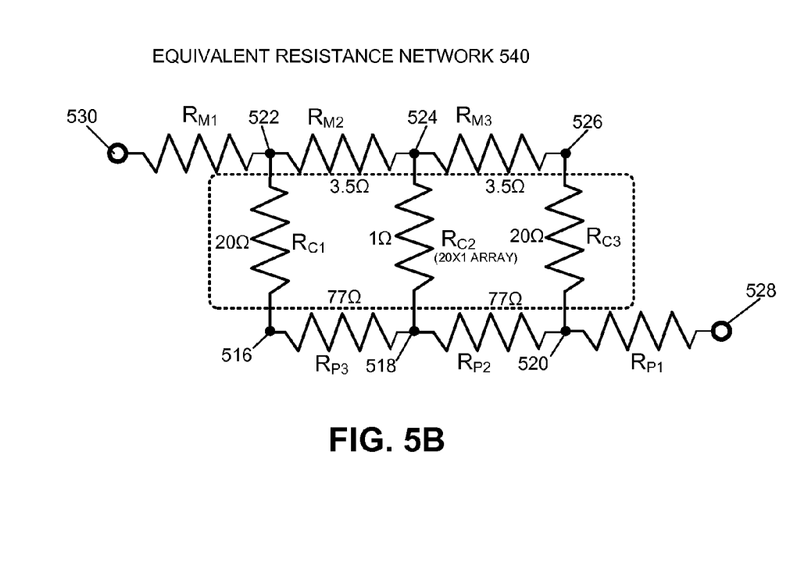

FIGS. 5A-5B illustrate a single row via array structure and a process for merging and extracting the via array in accordance with some embodiments described herein.

FIG. 5A presents a top-view of a physical layout 500 which comprises a poly line 504 (bottom layer) and a metal line 506 (top layer) overlap each other in a region 508 that contains a via array 510. In the embodiment shown, via array 510 comprises 22 vias arranged in a single row to electrically coupled poly line 504 and metal line 506. However, other embodiment can have fewer or more vias in a single row via array. Also note that on the surfaces of poly line 504 and metal line 506, via ray 510 becomes a row of contacts.

Based on the via merging technique described above, via array 510 is decomposed into two independent end vias 512 and 514 as two groups, and the other 20 vias between vias 512 and 514 that are merged into one group. Resistance is then extracted for each of the three groups. These extracted resistances are shown in FIG. 5B, which illustrates an equivalent resistance network 540 extracted based on physical layout 500.

The three groups from vias array 510 are represented by three vertically oriented resistances $R_{C1}$, $R_{C2}$, and $R_{C3}$, respectively, wherein $R_{C2}$ corresponds to the center via group. If we assign a resistance value 20 ohms to $R_{C1}$ and $R_{C3}$ as the extracted single via resistance, then $R_{C2}=20/(22-2)=1$ ohm. The three resistances are coupled to poly line 504 through three bottom nodes 516, 518, and 520; and to metal line 506 through three top nodes 522, 524, and 526. Note that FIG. 5B also includes an extracted resistance $R_{P1}$ for poly line 504 between node 528 at the end of poly line 504 and node 520, i.e., the poly contact of via 514; and an extracted resistance $R_{M1}$ for metal line 506 between node 530 at the end of metal line 506 and node 522, i.e., the metal contact of via 512.

To extract the underlying interconnect resistant of poly line 504 within the via region 510, one can simply multiply a sheet resistance (also referred as resistance per square or "RPSQ") of poly line 504 by the length of region 508. For example, if RPSQ of poly is 11 ohms and length of region 508 is 14, then the resistance of poly in region 508 equals 11×14=154 ohms. Once computed, this resistance is distributed equally among the three top nodes 516, 518, and 520 as $R_{P1}=R_{P2}=77$ ohms. Separately, if RPSQ of metal is 0.5 ohms, then the underlying interconnect resistance of metal in region 508 equals 0.5× 14=7 ohms. In a similarly manner to the poly line, the metal resistance is distributed equally among the three bottom nodes 522, 524, and 526 as $R_{M2}=R_{M3}=3.5$ ohms.

Figure 6A:
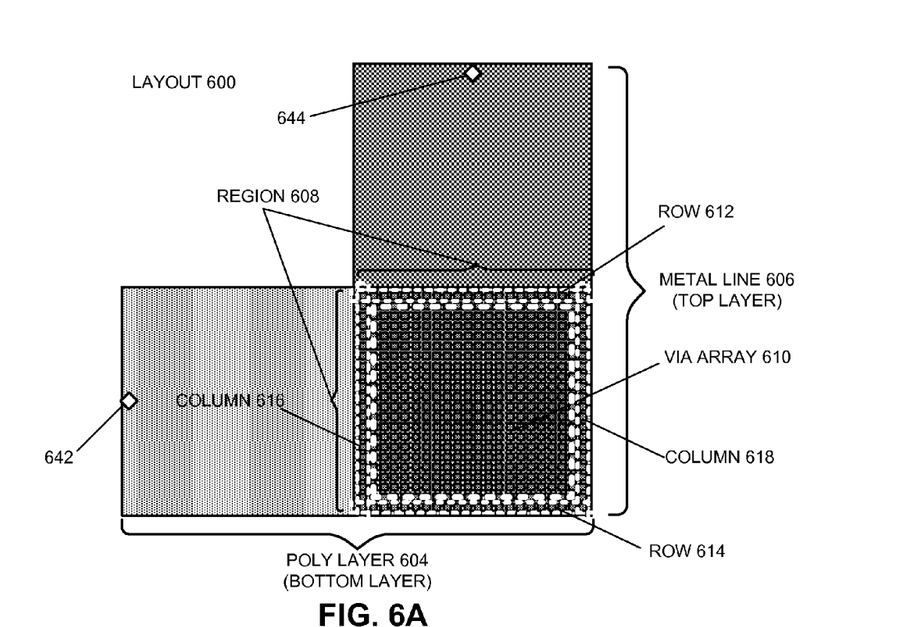
FIGS. 6A-6B illustrate a multiple row/column via array and a process for merging and extracting the via array in accordance with some embodiments described herein.
Figure 6B:
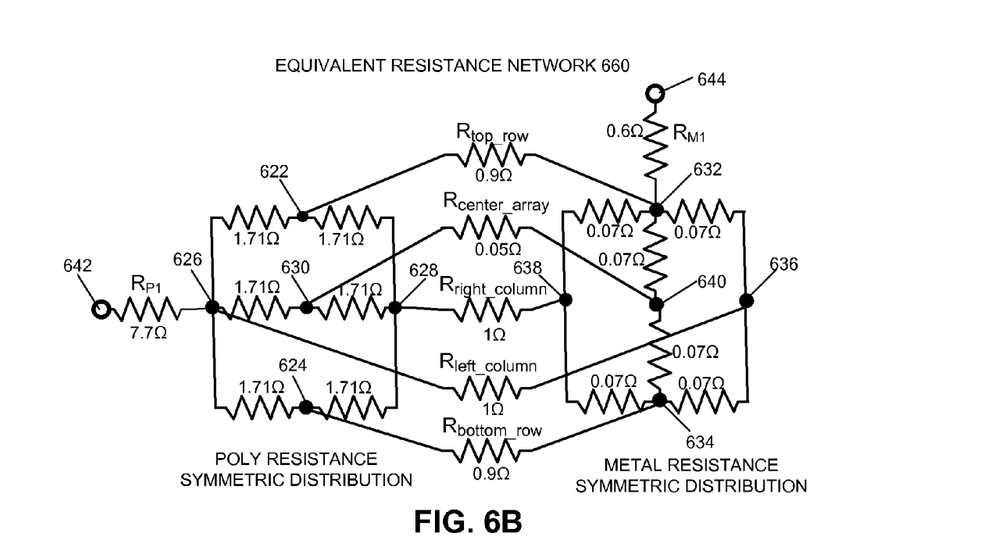

FIGS. 6A-6B illustrate a multiple row/column via array and a process for merging and extracting the via array in accordance with some embodiments described herein.

FIG. 6A presents a top-view of a physical layout 600 which comprises a poly layer 604 (bottom layer) and a metal line 606 (top layer) overlap each other in a region 608 that contains a via array 610. In the embodiment shown, via array 610 comprises 22×22 vias arranged in a square array to electrically coupled poly layer 604 and metal layer 606. Other embodiments can have fewer or more rows or columns in the array. Also note that on the surfaces of poly layer 604 and metal layer 606, via ray 610 becomes a 22×22 array of contacts.

Based on the via merging technique described above, via array 610 is decomposed into five groups: top row 612 (1×22) and bottom row 614 (1×22), which are merged into two separate groups; leftmost column 616 (20×1) and rightmost column 618 (20×1), which are also merged into two separate groups; and a center array (20×20) containing rest of the vias, which are merged into one group. Resistance is then extracted for each of the five groups. These extracted resistances are shown in FIG. 6B, which illustrates an equivalent resistance network 660 extracted based on physical layout 600.

The five merged groups from vias array 610 are represented by five horizontally-oriented resistances: $R_{top\_row}$ for top row 612; $R_{bottom\_row}$ for bottom row 614; $R_{left\_column}$ for leftmost column 616; $R_{right\_column}$ for rightmost column 618; and $R_{center\_array}$ for the center 20×20 array. If we assign a resistance value 20 ohms to a single via, then the five resistances can be obtained as $R_{top\_row} = R_{bottom\_row} = 20/22 = 0.9$ ohm; $R_{left\_column} = R_{right\_column} = 20/20 = 1$ ohm; $R_{center\_array} = 20/(20 \times 20) = 0.05$ ohm. The five resistances are coupled to poly layer 604 through five bottom nodes 622-630; and to metal layer 606 through five top nodes 632-640. In one embodiment, the bottom nodes 622, 624, 626 and 628 are located at the center of each edge of overlapping region 608 in poly layer 604, while node 630 is located at the center of region 608 in poly layer 604. In this embodiment, the top nodes 632, 634, 636 and 638 are located at the center of each edge of overlapping region 608 in metal layer 606, while node 640 is located at the center of region 608 in metal layer 606.

Note that FIG. 6B also includes an extracted resistance $R_{P1}$ for poly layer 604 between node 642 at the end of poly layer 604 and node 626, i.e., the poly contact of $R_{left\_column}$; and an extracted resistance $R_{M1}$ for metal layer 606 between node 644 at the end of metal layer 606 and node 632, i.e., the metal contact of $R_{top\_row}$.

To extract the underlying interconnect resistant of poly layer 604 in the via region 608, one can simply multiply RPSQ value of poly layer 604 by the total number of squares within region 308. For example, if RPSQ of poly is 11 ohms and region 308 has an aspect ration of 1, then the resistance of poly in region 308 equals 11 ohms. Once computed, this resistance is distributed equally among the five bottom nodes 622-630 along the direction of current flow. The distributed resistances are shown in FIG. 6B as six equal valued resistances of 1.71 ohm, wherein three resistances are coupled between node 626 and each of nodes 622, 624, and 630, and the other three resistances are coupled between node 628 and each of nodes 622, 624, and 630. Similarly, assuming that the RPSQ of metal is 0.5 ohms, the interconnect resistance of metal in region 608 equals 0.5×1=0.5 ohms. Similarly to the poly layer, the metal resistance is distributed equally among the six top nodes 632-640 along the direction of current flow, wherein each resistance has an equal value of 0.07 ohms.

Embodiments disclosed herein facilitate merging a large via array together without the need of breaking the via array into many small clusters. Moreover, the disclosed embodiments provide a consistent merging process with deterministic merging results, thereby significantly increasing predictability for merging via arrays of any sizes.

Figure 7:
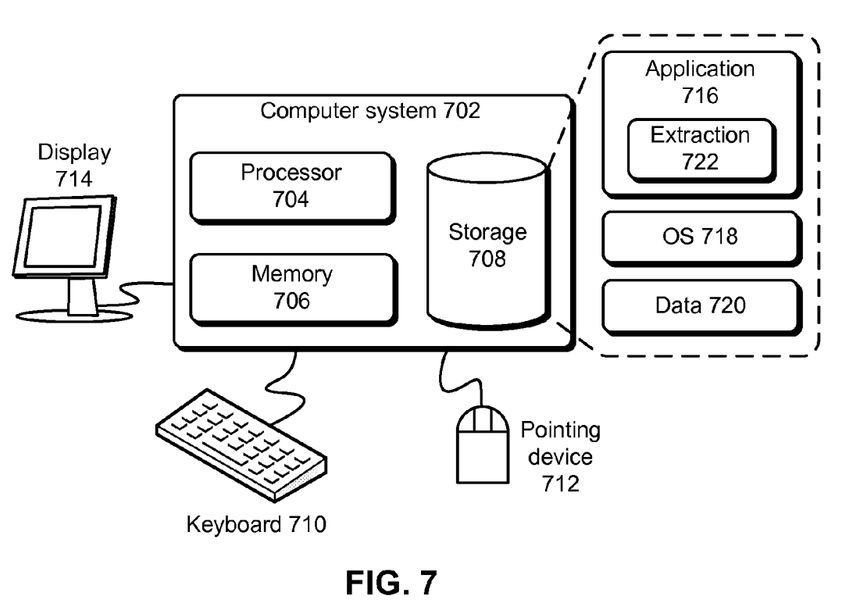
FIG. 7 illustrates a computer system in accordance with some embodiments described herein.

FIG. 7 illustrates a computer system in accordance with some embodiments described herein.

A computer system can generally be any system that can perform computations. Specifically, a computer system can be a microprocessor with one or more cores, a vector processor, an application specific integrated circuit, a distributed computing system, a cloud computing system, or any other computing system now known or later developed. Computer system 702 comprises processor 704, memory 706, and storage 708. Computer system 702 can be coupled with display 714, keyboard 710, and pointing device 712. Storage 708 can generally be any device that can store data. Specifically, a storage device can be a magnetic, an optical, or a magneto-optical storage device, or it can be based on flash memory and/or battery-backed up memory. Storage 708 can store application 716, operating system 718, and data 720.

Application 716 can include instructions that when executed by computer 702 cause computer 702 to perform one or more processes that are implicitly or explicitly described in this disclosure. Application 716 can include extraction module 722 which can be capable of merging vias for the purpose of parasitics extraction. Data 720 can include data that is required by application 716.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for performing parasitic extraction, the method comprising:
   identifying a via array in a physical layout, wherein the via array is coupled between a first layer and second layer; and
   in response to determining that the via array is a single row or column via array having at least four vias, a computer performing the following operations:
      identifying a first via and a last via in the via array,
      merging a set of vias between the first via and the last via into a center via, wherein said merging involves replacing a first set of contacts associated with the set of vias in the first layer with a first node of the center via, and replacing a second set of contacts associated with the set of vias in the second layer with a second node of the center via, and
      extracting a first via resistance, a last via resistance, and a center via resistance for the first via, the last via, and the center via, respectively.

2. The method of claim 1, wherein identifying a via array in the physical layout involves identifying two or more vias that interconnect a first conducting region in the first layer with a second conducting region in the second layer.

3. The method of claim 1, wherein the method further comprises:
   computing a first interconnect resistance in an area in the first layer which overlaps the footprint of the via array;
   computing a second interconnect resistance in an area in the second layer which overlaps the footprint of the via array;
   dividing the first interconnect resistance evenly between a first node of the first via, the first node of the center via, and a first node of the last via; and dividing the second interconnect resistance evenly between a second node of the first via, the second node of the center via, and a second node of the last via.

4. The method of claim 1, wherein each of the first via resistance and the last via resistance equals a single via resistance.

5. The method of claim 4, wherein extracting the via resistance for the center via involves dividing the single via resistance by the number of vias in the set of vias.

6. A method for performing parasitic extraction, the method comprising:
identifying a via array in a physical layout, wherein the via array is coupled between a first layer and second layer; and
in response to determining that the via array is a M×N (M≧4, N≧4) via array, a computer performing the following operations:
merging a first row and a last row of vias in the via array into a first row via and a last row via, respectively, wherein said merging involves replacing a first set of contacts associated with the first row of vias in the first layer with a first node of the first row via, replacing a first set of contacts associated with the last row of vias in the first layer with a first node of the last row via, replacing a second set of contacts associated with the first row of vias in the second layer with a second node of the first row via, and replacing a second set of contacts associated with the last row of vias in the second layer with a second node of the last row via,
merging a first column and a last column of vias in the via array into a first column via and a last column via, respectively, wherein said merging involves replacing a first set of contacts associated with the first column of vias in the first layer with a first node of the first column via, replacing a first set of contacts associated with the last column of vias in the first layer with a first node of the last column via, replacing a second set of contacts associated with the first column of vias in the second layer with a second node of the first column via, and replacing a second set of contacts associated with the last column of vias in the second layer with a second node of the last column via,
merging a set of vias between the first and last rows and the first and last columns into a center via, and
extracting a first and last row via resistances, a first and last column via resistances, and a center via resistance for the first and last row via, the first and last column vias, and the center via, respectively.

7. The method of claim 6, wherein merging the set of vias between the first and last rows and the first and last columns into the center via involves:
replacing a first set of contacts associated with the set of vias in the first layer with a first node of the center via; and
replacing a second set of contacts associated with the set of vias in the second layer with a second node of the center via.

8. The method of claim 7, wherein the method further comprises:
computing a first interconnect resistance in an area in the first layer which overlaps the footprint of the via array;
computing a second interconnect resistance in an area in the second layer which overlaps the footprint of the via array;
distributing the first interconnect resistance evenly among the first nodes of the first and last row vias, the first and last column vias, and the center via; and
distributing the second interconnect resistance evenly among the second nodes of the first and last row vias, the first and last column vias, and the center via.

9. The method of claim 8,
wherein distributing the first interconnect resistance evenly among the first nodes involves distributing the first interconnect resistance along a current direction in the first layer; and
wherein distributing the second interconnect resistance evenly among the second nodes involves distributing the second interconnect resistance along a current direction in the second layer.

10. The method of claim 6,
wherein extracting the first and last row or column via resistances involves dividing a single via resistance by the number of vias in a row or column of vias; and
wherein extracting the center via resistance involves dividing the single via resistance by the number of vias in the set of vias between the first and last rows and the first and last columns.

11. A method to perform parasitic extraction, the method comprising:
identifying a via array in a physical layout, wherein the via array is coupled between a first layer and second layer;
determining whether the via array is a single row or column via array having at least four vias or a M×N (M≧4, N≧4) via array;
in response to determining that the via array is a single row or column via array having at least three vias, a computer performing a first via merging and parasitic extraction process that includes:
identifying a first via and a last via in the via array,
merging a set of vias between the first via and the last via into a center via, and
extracting a first via resistance, a last via resistance, and a center via resistance for the first via, the last via, and the center via, respectively; and
in response to determining that the via array is a M×N (M≧4, N≧4) via array, the computer performing a second via merging and parasitic extraction process that includes:
merging a first row and a last row of vias in the via array into a first row via and a last row via, respectively,
merging a set of vias between the first and last rows and the first and last columns into a center via, and
extracting a first and last row via resistances, a first and last column via resistances, and a center via resistance of the first and last row via, the first and last column vias, and the center via, respectively.

12. The method of claim 11, wherein identifying a via array in the physical layout involves identifying two or more vias that interconnect a first conducting region in the first layer with a second conducting region in the second layer.

13. The method of claim 11, wherein merging the set of vias between the first via and the last via into the center via involves:
replacing a first set of contacts associated with the set of vias in the first layer with a first node of the center via; and
replacing a second set of contacts associated with the set of vias in the second layer with a second node of the center via.

14. The method of claim 11, wherein each of the first via resistance and the last via resistance equals a single via resistance.

15. The method of claim 11, wherein merging the set of vias between the first via and the last via into the center via involves:
- replacing a first set of contacts associated with the set of vias in the first layer with a first node of the center via; and
- replacing a second set of contacts associated with the set of vias in the second layer with a second node of the center via.

16. The method of claim 11,
- wherein extracting the first and last row or column via resistances involves dividing a single via resistance by the number of vias in a row or column of vias; and
- wherein extracting the center via resistance involves dividing the single via resistance by the number of vias in the set of vias between the first and last rows and the first and last columns.

\* \* \* \* \*